United States Patent
Anaraki et al.

(10) Patent No.: US 8,121,560 B1
(45) Date of Patent: Feb. 21, 2012

(54) PRE-DISTORTION WITH ENHANCED CONVERGENCE FOR LINEARIZATION

(75) Inventors: Majid Nemati Anaraki, Sunnyvale, CA (US); Armando C. Cova, Sunnyvale, CA (US)

(73) Assignee: Scintera Networks, Inc., Sunnyvale, CA (US)

(*) Notice: Subject to any disclaimer, the term of this patent is extended or adjusted under 35 U.S.C. 154(b) by 695 days.

(21) Appl. No.: 12/257,313

(22) Filed: Oct. 23, 2008

(51) Int. Cl.
*H04B 1/04* (2006.01)

(52) U.S. Cl. .................................. 455/114.3

(58) Field of Classification Search ............... 455/114.3, 455/114.2
See application file for complete search history.

(56) References Cited

U.S. PATENT DOCUMENTS

| | | | |
|---|---|---|---|
| 6,240,278 B1 * | 5/2001 | Midya et al. | 455/126 |
| 7,372,918 B2 * | 5/2008 | Muller et al. | 375/296 |
| 7,499,501 B2 * | 3/2009 | Chung et al. | 375/297 |
| 7,689,180 B2 * | 3/2010 | Grundlingh et al. | 455/126 |
| 7,702,301 B2 * | 4/2010 | Rabjohn et al. | 455/126 |
| 7,804,359 B1 * | 9/2010 | Cova | 330/149 |

* cited by examiner

*Primary Examiner* — Lincoln Donovan
*Assistant Examiner* — Khareem E Almo
(74) *Attorney, Agent, or Firm* — Haynes and Boone, LLP

(57) ABSTRACT

A pre-distorter is provided for distorting an RF input signal to provide a pre-distorted radio frequency (RF) input signal to an amplifier that provides an amplified RF output signal, wherein the RF input signal has an envelope. The pre-distorter includes: a radio-frequency signal processing circuit that distorts the RF input signal according to a polynomial of powers of the envelope, each power of the envelope being weighted by a corresponding pre-distortion weight; and a performance monitor operable to compare a version of the amplified RF output signal to a delayed version of the RF input signal to provide an error signal, wherein the performance monitor is configured to iteratively adapt the coefficients based upon a gradient of a cost function, the cost function being a function of the error signal.

19 Claims, 8 Drawing Sheets

PRE-DISTORTION WITH ENHANCED CONVERGENCE FOR LINEARIZATION

TECHNICAL FIELD

The present invention relates to linearization and more particular to pre-distorting signals for linearization of components such as amplifiers.

BACKGROUND

Power amplifiers in communication systems are a main source of non-linearity, e.g., input signals are generally distorted during amplitude modulation, especially as the power nears the saturation level of the amplifier. Another source of non-linearity is memory effects. Generally, memory effects cause additional odd order, e.g., $3^{rd}$, $5^{th}$, $7^{th}$, etc., intermodulation distortion. Memory effects may include, but are not limited to, power amplifier self-heating and decoupling of the power amplifier from a power supply. In self-heating, as the power amplifier power level increases, heat is built up in the devices used in the power amplifier. Conversely, a decrease in the power level causes cooling of the devices. Such heating and cooling of the devices generally results in odd order distortion.

One method for reducing distortion and non-linearity is to operate the power amplifier in a linear region below its maximum power capacity, i.e., backing off. However, this would require a larger amplifier than would otherwise be the case, thereby, making the system less efficient and more expensive. This problem is made more severe by modern wide bandwidth modulation schemes, such as CDMA, WCDMA and UMTS, which employ signals with large random signal peaks. Therefore, it is highly desirable to reduce distortion while maintaining amplifier efficiency by reducing distortion without simply making the amplifier bigger. One approach is to pre-distort the input signal prior to amplification to correct for amplifier nonlinearities.

There are many methods for pre-distorting signals to linearize power amplifiers. Typically, a pre-distortion unit is placed between the input signal and the power amplifier, where the pre-distortion unit receives signals for distorting the input signal based on feedback signals from the amplifier output signal. Thus, before the signal is amplified, an estimate is made of the manner in which the amplifier will non-linearly distort the particular input signal by amplifying that signal. The signal to be amplified is then "pre-distorted" by applying to it a transformation in a manner estimated to be complementary to the non-linearity which the amplifier itself will apply as it amplifies the signal. Ideally, the pre-distorting transformation is cancelled out by the amplifier's non-linearity, resulting in an undistorted, amplified output signal. In general, conventional pre-distortion to reduce non-linearity was performed at baseband in the digital domain. But note that the non-linearity introduced by the power amplifier is analog and in the RF domain. The resulting necessity to digitize and analyze the non-linearity at baseband results in unnecessary power consumption and complication.

An alternative to conventional pre-distortion techniques and systems is disclosed in commonly-assigned U.S. application Ser. No. 11/484,008, now U.S. Pat. No. 7,844,014, filed Jul. 7, 2006 (hereinafter the '008 application), the contents of which are incorporated by reference in their entirety, wherein the pre-distortion is performed in the RF domain rather than at baseband. In the '008 application, an error signal is calculated through comparison of a properly-scaled version of the amplified output signal from the power amplifier to the power amplifier's input signal. Should the power amplifier be perfectly linear, this error signal is zero. However, real-world power amplifiers will produce some non-linearity in the output signal such that the error signal is non-zero.

To pre-distort the power amplifier input signal in the RF domain, the input signal is typically multiplied with a pre-distorting signal. For example, an RF input signal may be represented by the real part of $\{R(t)*\exp(j\omega_c t)\}$, where $R(t)$ is the complex envelope, j is the imaginary unit, $\omega_c$ is the angular frequency for the RF carrier bearing the complex envelope modulation, and t is time. It may thus be seen that the pre-distortion signal is a baseband signal because the pre-distortion signal is a function of the complex envelope $R(t)$ and not of the RF carrier. In that regard, a pre-distortion signal may be represented by a Taylor series expression: $\alpha_1 + \alpha_2*R(t) + \alpha_3*R(t)^2 + \alpha_4*R(t)^3 + \ldots$, where the alpha symbols represent pre-distortion coefficients, which may also be denoted as pre-distortion weights. Upon multiplication of such a pre-distortion signal with the RF input signal, the resulting pre-distorted RF signal that is produced becomes the real part of $\{[\alpha_1*R(t) + \alpha_2*R(t)^2 + \alpha_3*R(t)^3 + \alpha_4*R(t)^4 + \ldots]*\exp(j\omega_c t)\}$. It is this pre-distorted RF signal that is supplied as an input signal to the power amplifier. The final envelope power in the pre-distorting signal depends upon the complexity of the design and desired precision. For example, suppose the final power in the series expression is five, corresponding to $R(t)^5$. In such an embodiment, it may be seen that a signal generator generating the pre-distorting signal must solve for six coefficients in the Taylor series, ranging from $\alpha_1$ to $\alpha_6$.

The envelope term associated with each pre-distortion weight in the pre-distortion signal may be designated as a corresponding monomial "basis" function. Thus, the monomial basis function associated with pre-distortion weight $\alpha_1$ is $R(t)^0$, the basis function associated with pre-distortion weight $\alpha_2$ is $R(t)$, the basis function associated with pre-distortion weight $\alpha_3$ is $R(t)^2$, and so on. The pre-distortion weights associated with the basis functions may be determined in a variety of fashions. In an example analytical approach, a signal generator may include a correlator for each pre-distortion weight. Each correlator correlates the error signal with the basis function corresponding to the correlator's pre-distortion weight. Although analytically correct in theory, it may be shown that such a selection of monomial basis functions will not typically produce desirable real-world results because the convergence time to a solution is too long. To enhance the convergence speed, the '008 application discloses that each basis function may be an orthonormal polynomial formed from the above-discussed mononomial basis functions.

Although the '008 application discloses a power amplifier linearization technique that has lower bandwidth demands, higher precision, and lower power consumption as compared to conventional schemes that perform their distortion in the digital baseband domain, correlation in the RF analog domain to generate the coefficients can lead to mismatches. This mismatch occurs because a correlation determines the pre-distortion weights for the basis functions used to create a pre-distortion signal for pre-distorting the RF input signal. A pre-distortion signal must then be created based upon these determined pre-distortion weights by multiplication with the basis functions. A second multiplication is then required to multiply the input signal with the resulting pre-distorting signal. Because of circuit non-idealities and other effects, the pre-distorting signal may have coefficients that are slightly different from the analog coefficients that result from the correlation. Moreover, even if such non-idealities could be eliminated, improvements in convergence speed are desirable.

Accordingly, there is a need in the art for improved power amplifier linearization techniques.

SUMMARY

A pre-distorter generates an error signal that represents the degree of non-linearity introduced into an output signal by an amplifier amplifying an input signal to produce an amplified output signal by comparing the output signal to a delayed version of the input signal. To reduce the non-linearities introduced into the output signal by the amplifier, the pre-distorter distorts the input signal provided to the amplifier. The pre-distorter distorts the input signal according to a polynomial of various powers of an envelope for the input signal. Each of the powers of the envelope is weighted by a corresponding pre-distortion weight.

The pre-distorter iteratively adapts the pre-distortion weights responsive to the error signal. The error signal defines an error space as a function of the various pre-distortion weights. A global minimum in this error space defines corresponding values for the pre-distortion weights that produces a minimum amount of non-linearity in the amplifier's output signal. An iterative adaptation of the pre-distortion weights searches for the global minimum. To speed convergence to this global minimum, a linear transformation of the pre-distortion coefficients is provided. In this fashion, non-linearities may be cancelled at an enhanced convergence rate.

Embodiments of the present invention and their advantages are best understood by referring to the detailed description that follows.

DESCRIPTION OF THE DRAWINGS

It should be appreciated that like reference numerals are used to identify like elements illustrated in one or more of the figures.

DETAILED DESCRIPTION

The following discussion is directed to the linearization of a power amplifier. However, it will be appreciated that the linearization techniques disclosed herein have broad application to the linearization of any ostensibly linear element that introduces some degree of non-linear distortion in its output signal.

To provide a linearization technique that has improved convergence speed as well as greater flexibility with regard to a selective spectral suppression of non-linearity, the error signal is calculated in the digital domain. This digital error signal calculation is advantageous in that efficient spectral transformation techniques such as a Fast Fourier Transform (FFT) may be performed on the resulting digital error signal to determine its power in various frequency bands. For example, if a power amplifier is used in a base station within a cellular communication network, the out-of-band interference introduced by non-linearities in the base station amplifier may interfere with communication by others in neighboring frequency bands. A spectral performance module (SPM) is disclosed to generate the error signal from a version of the power amplifier output signal (designated as RF FeedBack (RFFB)) to a version of the RF input signal (designated as RF Input Signal (RFINS)). The SPM performs digital signal operations to delay, amplitude match, and phase align RFFB and RFINS. The resulting matched signals are subtracted to compute an discrete time estimate of the error signal at complex baseband (designated as $e_{BB}(kT_s)$):

$$e_{BB}(kT_s)=\text{RFFB}(kT_S)-\text{RFINS}(kT_S-T_{PA}) \tag{1}$$

where RFINS is delayed by the value of a forward-observation path delay $T_{PA}$ through the power amplifier (PA) to delay match it to RFFB and $T_S$ represents the sampling period of the discrete signal sequences and k is an integer index.

The error signal $e_{BB}(kT_s)$ generated by the SPM contains information about the output distortion of the PA that is used to adaptively compute pre-distortion weights (the alpha coefficients discussed previously) in order to minimize non-linear distortion in the power amplifier output signal. The SPM can then discriminate error energy in different frequency sub-bands as will be described further herein.

Figure 1:
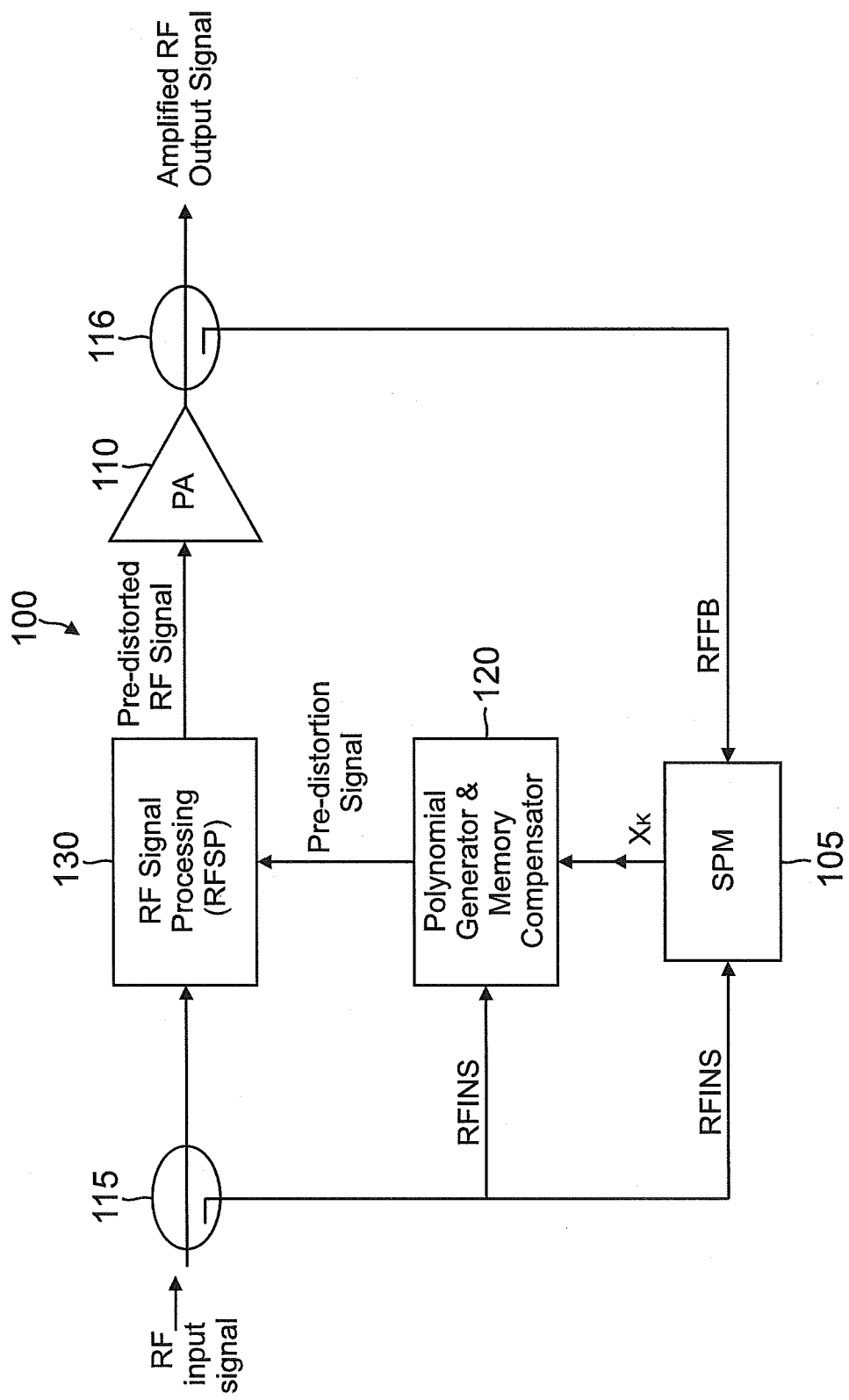
FIG. 1 is a system-level view of an example pre-distorter for linearizing a power amplifier.

Turning now to the drawings, FIG. 1 shows the integration of a spectral performance monitor (SPM) 105 within an example pre-distorter 100 for linearizing a power amplifier (PA) 110. SPM 105 receives RFINS and RFFB and calculates the error signal $e_{BB}(kT_s)$ as discussed above. In addition, SPM 105 drives an SPM coefficient adaptation algorithm responsive to the value of the error signal to generate the pre-distortion coefficients (which may also be designated as pre-distortion weights), represented by a vector $X_k$ for a given iteration step k. Signals RFFB and RFINS may be obtained using RF couplers 116 and 115, respectively.

A polynomial generator and memory compensator module 120 receives the vector $X_k$ as well as a version of RFINS. As will be explained further, module 120 includes an envelope detector to detect the envelope signal R(t) discussed previously as well as a power detector to detect the square of the envelope $R(t)^2$. Recall that a pre-distortion signal is a polynomial in the form of $\alpha_1+\alpha_2*R(t)+\alpha_3*R(t)^2+\alpha_4*R(t)^3+\ldots$, where the various higher powers of the envelope may be formed using appropriate multiplications of R(t) and $R(t)^2$.

Thus, module 120 synthesizes the various monomial basis functions (powers of the envelope) and weights them according to the current pre-distortion weights from vector $X_k$ to provide the pre-distortion signal. To account for short-term and long-term memory effects in the power amplifier, module 120 adjusts the pre-distortion signal with feedforward and feedback techniques as will be discussed further herein.

An RF signal processing (RFSP) module 130 receives the RF input signal and multiplies this signal with the pre-distortion signal from module 120 to provide a resulting pre-distorted RF input signal to the power amplifier. Note that the majority of the power for the pre-distorted RF input signal will be in the linear term, which is the real part of $(\alpha_1 *R(t)* \exp(j\omega_c t))$. Commonly-assigned U.S. application Ser. No. 12/190,781, filed Aug. 13, 2008, (hereinafter the '781 application), the contents of which are incorporated by reference in their entirety, discloses an RFSP that exploits this power difference between the linear term and the non-linear terms in the pre-distorted RF input signal to maximize dynamic range and minimize noise during the production of this signal. These three main components of pre-distorter 100 (the SMP, the polynomial generator and memory compensator, and the RFSP) will now be discussed in greater detail, beginning with the SPM.

The Spectral Performance Monitor (SPM)

As discussed with regard to the '008 application, one technique to calculate the pre-distortion weights for a given iteration of vector X (designated as the kth iteration, $X_k$) is to correlate the error signal with various basis functions. However, a greater convergence speed for calculating the pre-distortion weights may be achieved through an iterative non-linear optimization technique. The number of pre-distortion weights depends upon the polynomial order one wishes to correct for in the pre-distorted RF input signal that will be produced for driving the power amplifier. For example, if the pre-distorted RF input signal includes up to the $7^{th}$ power of the envelope R(t), the error signal is represented by 14 dimensions because of the in-phase (I) and quadrature-phase (Q) versions of the various complex envelope powers.

Regardless of the desired final envelope power in the pre-distorting signal (and hence dimensions that will be used in the error signal), the pre-distortion weights may represented by a vector $X_k$ at an arbitrary calculation step k. The non-linear optimization occurs with regard to a cost function f of the vector $X_k$ that is represented as $f(X_k)$. A mathematically optimum cost function is the mean square of the error signal (MSE). However, other cost functions may also be implemented. The expression for a subsequent iteration (k+1) may then be represented as:

$$X_{k+1} = X_k - \lambda_k * \nabla f(X_k) \qquad (2)$$

where $\nabla f(X_k)$ represents the gradient of the cost function and $\lambda_k$ is an optional weighting.

Figure 2B:
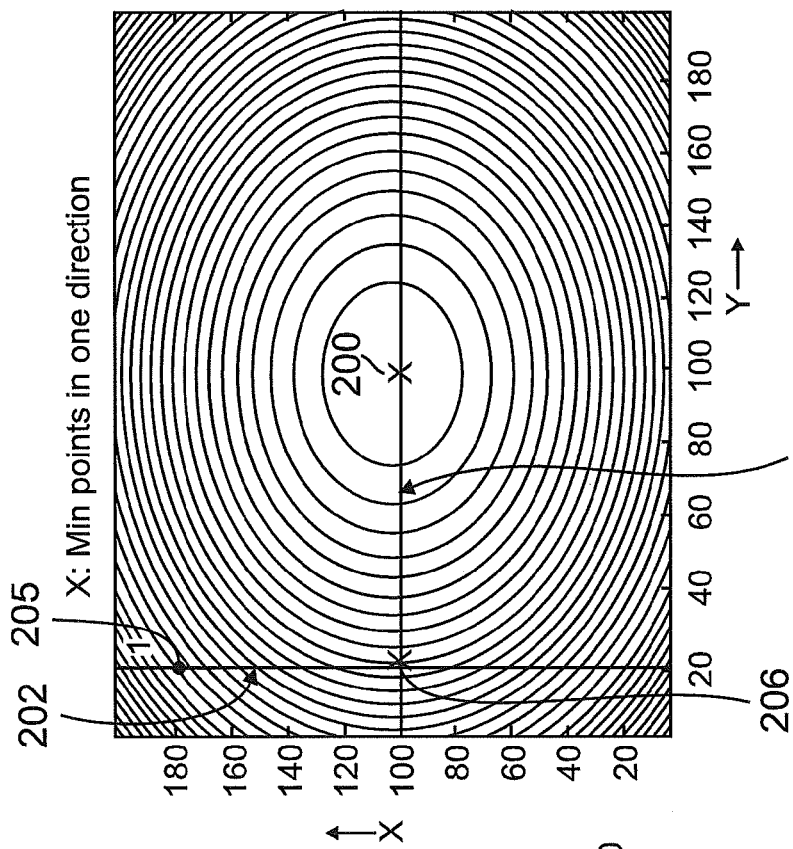
FIG. 2*b* is a top view of the error space of FIG. 2*a;*
Figure 2A:
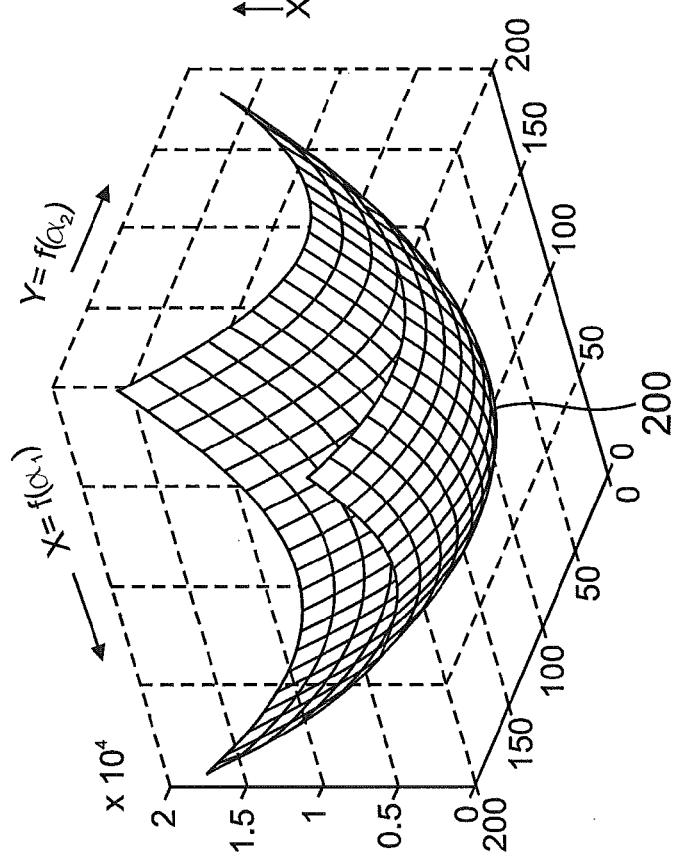
FIG. 2*a* is a perspective view of a two-dimensional error space having independent dimensions.

Algorithms will be discussed below for iteratively calculating the pre-distortion weights based upon equation (2). For example, consider a simplified example wherein the power amplifier's non-linear distortion is merely quadratic, thereby producing a square of the envelope R(t) in the amplified output signal. In such a case, there are only two correlation weights that need adjusting in the pre-distorted RF signal that is supplied to the power amplifier such that the pre-distorted RF signal may be represented as the real part of $((\alpha_1 *R(t) + \alpha_2 *R(t)^2)*\exp(j\omega_c t)$. Although both the alpha coefficients are complex numbers, the following discussion will treat them as scalars for clarity of illustration. In such an example, there would thus be just two "knobs" (corresponding to $\alpha_1$ and $\alpha_2$) that can be adjusted so as to minimize the resulting error signal. The resulting two-dimensional error space may be as illustrated in shown in FIG. 2a. A first "x" dimension for this error space corresponds to a function of one of the pre-distortion weights (e.g., $\alpha_1$) whereas the remaining "y" dimension for the error space corresponds to a function of a remaining one of the pre-distortion weights (in this case, $\alpha_2$). There is a minimum error corresponding to a point 200 produced by corresponding values of x and y as determined by appropriate values of $\alpha_1$ and $\alpha_2$) A priori, an SPM does not know the optimum settings for $\alpha_1$ and $\alpha_2$ but must instead search for them by iteratively setting certain values for these coefficients and testing the resulting error that is produced. Such an iterative search is considerably simplified if the error space dimensions are independent such as shown in FIG. 2a. This independence is better illustrated through a plan view of this error space as shown in FIG. 2b. The error dimensions are independent because a minimum in the dimension x does not depend upon the dimension y and vice-versa. For example, suppose an SPM initially selected a value for the alpha coefficients corresponding to point 205 in FIG. 2b. If $\alpha_2$ is kept constant and $\alpha_1$ changed in increments to define points along a line 202 and the resulting error tested, a minimum error (as a function of just x which in turn is a function of $\alpha_1$) may be found at a point 206. Because of the dimension independence, the x value for the true error minimum (point 200) will not be different from the x dimension for the local minimum at point 206. Thus, the SPM may then keep $\alpha_1$ constant and begin varying $\alpha_2$ such that the error space is traversed across a line 208 until the true minimum is reached at point 200.

Figures 3A, 3B:
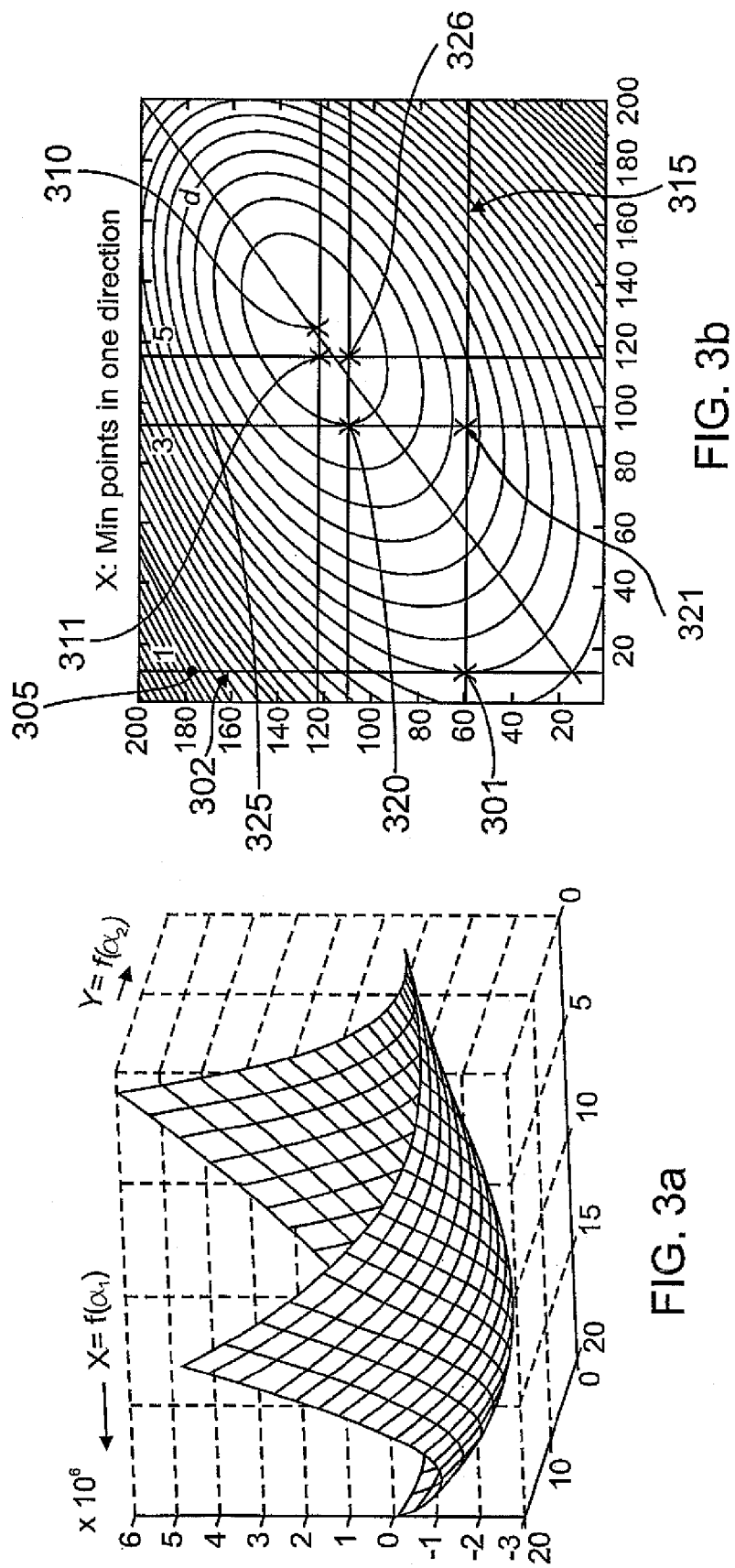
FIG. 3*a* is a perspective view of a two-dimensional error space having dependent dimensions.
FIG. 3*b* is a top view of the error space of FIG. 3*a;*
Figures 4, 6:
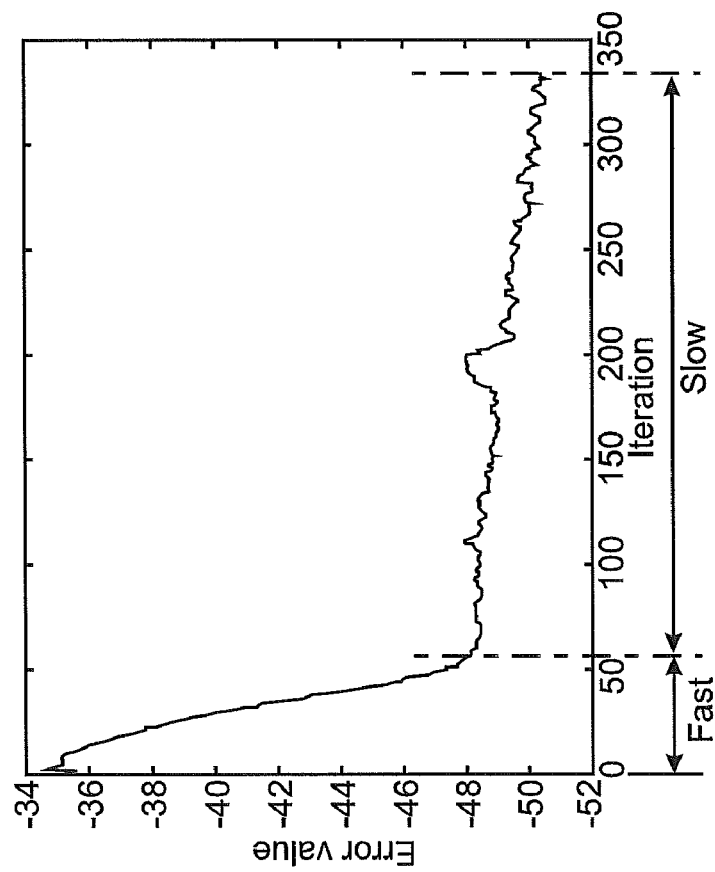
FIG. 4 illustrates the convergence rate for an example error space having dependent dimensions.
FIG. 6 illustrates a matrix for transforming pre-distortion coefficients to minimize the dependence in the resulting error space dimensions.

Finding a minimum value in the error space is not so straightforward if the error dimensions are dependent as shown in perspective view in FIG. 3a and in plan view in FIG. 3b. Because of the dimension dependence, a local minimum 301 found on a line 302 as $\alpha_1$ is varied from an arbitrary starting point 305 and $\alpha_2$ kept constant has a different x-dimension than that for a true minimum location 310 in the error space. As a result, an iterative search for the true minimum location will "ping-pong" between the dimensions as it drifts from local minimum to local minimum. For example, if the x-dimension is kept constant as y is varied from location 301 along a line 315, another local minimum location 321 is determined. To find the true minimum, another x-dimension change leads to a local minimum location 320 along a line 325. Successive iterations in respective dimensions leads to additional local minimum 326 and 311 before finding true minimum location 310. It will be appreciated that for more complex error spaces such as the 14-dimensional space discussed previously, the convergence to a solution can thus become burdensomely slow in a dependent error space. However, real-world power amplifiers will generally produce error spaces that have dependent dimensions with respect to the pre-distortion weights $\alpha_1$, $\alpha_2$ and so on discussed previously for the various envelope powers in the pre-distorted RF input signal that drives the power amplifier. If these pre-distortion weights are changed in an iterative fashion as discussed analogously with regard to FIG. 2a through 3b, a convergence to a solution may resemble the example convergence rate shown in FIG. 4, where a relatively large reduction in the error value is achieved over the first 50 iterations but then much more slowly over the subsequent several hundred iterations. Moreover, as shown in the dependent error space of FIG. 5, if the increment that the SPM adjusts the x or y dimensions is sufficiently large so as to attempt to decrease the required number of iterations, a false minimum is detected at a point B as opposed to iterations from a point A.

Figure 5:
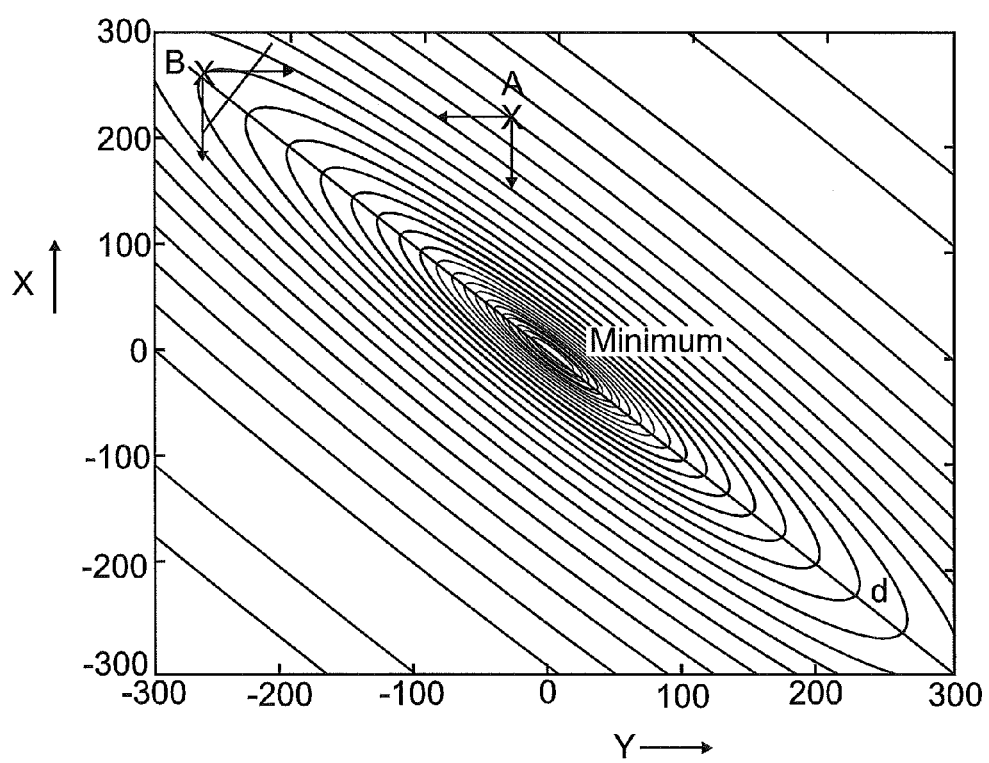
FIG. 5 is a top view of another dependent-dimension error space.

It can thus be seen that the dependent dimensions for the error spaces of real-world power amplifiers leads to at least two problems: poor convergence and the possibility of false minimums. To improve convergence speed and lower the false minimum probability, a correlation matrix and decomposition technique could be performed but at a heavy computation cost. To provide a more efficient solution to error dimension independence, the SPM iteratively changes abstract pre-distortion weights as discussed above. However, these weights are "abstract" because they are not applied to the various envelope powers to form the pre-distorted RF input signal to the power amplifier. Instead if a vector $A_{RFPAL}$ represent a seven-dimension vector of the actual pre-distortion weights and a vector $A_{Alg}$ represents the seven abstract weights adapted by the SPM, a simple fixed transformation of $$A_{RFPAL} = TA_{Alg} \quad (3)$$

where T is a matrix as shown in FIG. 5 leads to much greater independence in the error dimensions. It will be appreciated that the linear transformation represented by matrix T would be applied to both the in-phase (I) and quadrature-phase (Q) portions of the complex-valued pre-distortion weights that are iteratively adapted by the SPM. Other linear transformations may be derived accordingly should the error space be varied from seven dimensions.

Referring back to equation (2), the SPM may then iteratively adapt the vector $X_k$ (corresponding to given values for the vector $A_{Alg}$ just discussed at an arbitrary kth iteration, k being a positive integer) in a number of fashions. The cost function f is a function of the error signal, with the mean square of the error being the mathematically most ideal cost function. The gradient of the cost function $\nabla f(X_k)$ is defined as the vector $[\nabla f(X_k)/\nabla x_{1,k}, \ldots, \nabla f(X_k)/\nabla x_{j,k}]$, where $X_{j,k}$ represents the jth component of the vector $X_k$. To calculate the gradient, each pre-distortion coefficient (in the pre-transformed space) is changed by a small value and the cost function measured.

Although one could iteratively adapt the coefficients in this fashion as given by equation (2), convergence and accuracy may be increased by adapting the pre-transformed pre-distortion coefficients as follows. Let sets Mk and Mk+1 be defined as the sets containing the pre-transformed pre-distortion coefficients at iteration steps k and k+1, where an "iteration step" refers to the update of all vector components. For each dimension in updating iteration k, the updating process can be written as $$X_{next}^{i} = X_{k+1}^{i} - \lambda_{k+1} \nabla_{k,k+1}^{i} f \\ (X_{\{i+,\ldots,n\} \in MK}^{\{1,\ldots,i-1\} \in MK+1}) \quad (4)$$

where $X_k$ is the $i^{th}$ component of vector X at iteration k, $X_{\{i+,\ldots,n\} \in MK}^{\{1,\ldots,i-1\} \in MK+1}$ represents vector X when its first $i^{th}$ components are updated to new values from iteration k+1 and components (i+1) to n are still from the $k^{th}$ iteration, n is the integer number n of dimensions in the vector X, and $\nabla_{k,k+1}^{i} f(X_{\{i+,\ldots,n\} \in MK}^{\{1,\ldots,i-1\} \in MK+1})$ is an estimate of the gradient of the cost function for dimension i at point $X_{\{i+,\ldots,n\} \in MK}^{\{1,\ldots,i-1\} \in MK+1}$ when $X_k^i$ proceeds to $X_{k+1}^i$. After the nth step in an iteration k, $X_{next}$ serves as $X_{k+1}$ for the subsequent iteration. It can be shown that such an iteration to solve equation (2) leads to optimal convergence. In addition, a random permutation in the order of dimensions for which the gradient is being calculated will inhibit the false minimum problem discussed with regard to FIG. 5.

Referring back to FIG. 1, if the RF input signal is assumed to be stationary and ergodic, the optimum cost function is the mean square error $M_0$ as given by the following equation $$M_0 = E\{|RFFB(t) - K^* RF_{delay}(t)|^2\} \quad (5)$$

where E is the expected value operation, $RF_{delay}(t)$ is a delayed version of RFINS, and K is a gain factor that minimizes the metric. More precisely, without considering pre-distortion, K is a gain set such that the error is orthogonal to $RF_{delay}(t)$. It can be shown that K is thus given by the following expression:

$$K = \frac{\int RFdelay(t) RFFB(t) dt}{\int RFdelay(t) RFdelay(t) dt} \quad (6)$$

Calculating the error signal in the digital domain leads to efficient spectral transformations such as the Fast Fourier Transform (FFT) that may be used to calculate spectral parameters such as the power spectral density (PSD) of the error signal, represented as $S_c(f)$, where f is frequency. The mean square error $M_0$ can be rewritten as the integral over frequency of $S_c(f)$. But note that the spectral transformation of the error signal leads to interesting and advantageous results. For example, if a power amplifier is to amplify an input signal limited to an in-band bandwidth (all other frequencies being considered out-of-band), the integral of the PSD for the error signal may be calculated separately for the in-band and out-of-band portions. In this fashion, the cost function can be made to depend upon linear combinations of the in-band and out-of-band PSDs for the error signal. This is advantageous because mismatches in phase, delay, and gain between RFFB(t) and $RF_{delay}(t)$ cause non-idealities in the resulting pre-distortion solution. But if the cost function is made to depend solely upon functions of out-of-band PSD for the error signal, such non-idealities will be minimized since $RF_{delay}(t)$ will have little out-of-band energy. Thus, inaccuracies in delay matching $RF_{delay}(t)$ to RFFB in such an out-of-band embodiment will have relatively little effect on the resulting error signal.

A common criteria of performance for power amplifiers in cellular base stations is to minimize the adjacent channel leakage ratio (ACLR). A cost function may be generated that more directly corresponds to ACLR. For example, one approach is to minimize the multiplication of power in different spectral regions. For example, the cost function could be broken down into 3 values, corresponding to a function of the energy in the error signal PSD in a lower frequency band as compared to an energy for an in-band error signal PSD and as compared to the energy in the error signal PSD in a higher frequency band as compared to the in-band portion. In one embodiment, at each iteration step, the gradient is taken for either the lower or upper out-of-band error spectra, whichever is greater. In this fashion, the ACLR may be minimized.

To implement the iterative adaptation of the pre-distortion weights, the SPM may comprise a microprocessor, digital signal processor, programmable logic device, or micro-controller. Alternatively, a dedicated ASIC could be used to instantiate the SPM. Regardless of the implementation for the SPM, non-idealities should be avoided in calculating the error signal from RFFB and RFINS. The error calculation by the SPM will now be discussed.

SPM Error Signal Calculation

As discussed above, the pre-distortion weights may be formed by iteratively adapting them based upon a cost function of the error signal. Although the iterative adaptation provides rapid convergence to a solution, such a solution is buttressed on a proper formation of the error signal. In particular, accurate error signal formation is quite sensitive to the group delay mismatch between signals RFINS and RFFB discussed with regard to FIG. 1. As shown in FIG. 1, SPM 105 receives signals RFINS and RFFB to calculate an error signal.

The input signal RFINS should be delayed by the group delay through power amplifier 110 so that an "apples-to-apples" comparison may be made to form the error signal. If RFINS is not properly delayed, the error signal does not represent the true error but is instead distorted by the asynchronicity between the delayed version of RFINS and RFFB. In addition, phase and gain imbalances should be addressed before forming the error signal.

Figure 7:
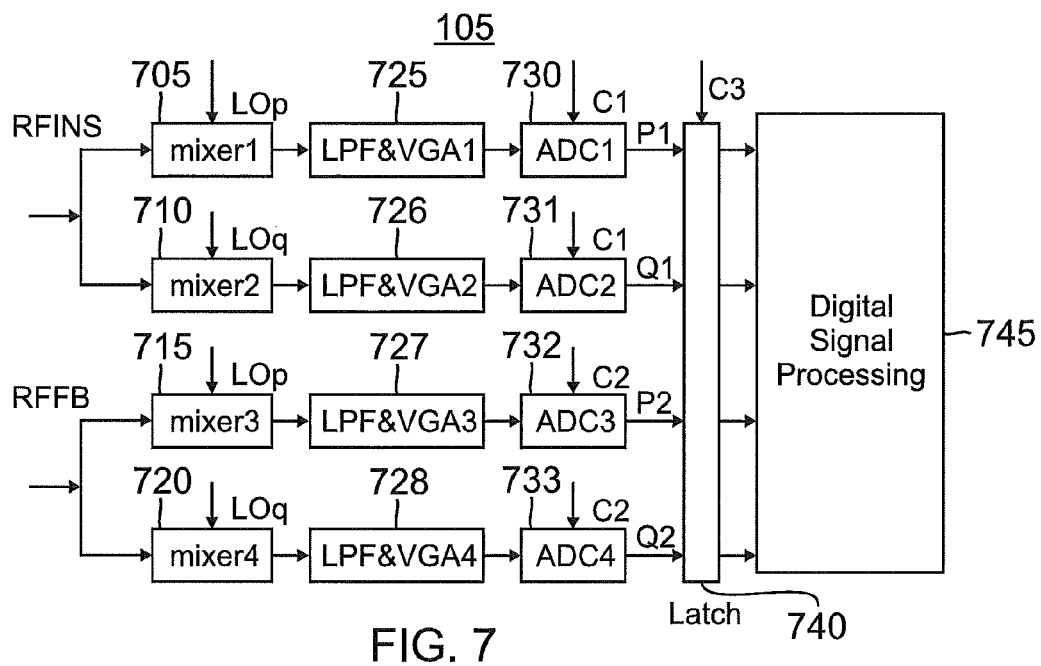
FIG. 7 illustrates some digital hardware within the SPM of FIG. 1 for time-aligning, gain-matching, and phase-aligning the RF feedback signal and the RF input signal prior to calculating the error signal.

Referring now to FIG. 7, an example SPM 105 is shown in greater detail to illustrate circuitry for forming the error signal. RFINS and RFFB (introduced with respect to FIG. 1) are quadrature demodulated into in-phase (I) and quadrature-phase (Q) signals. A source such as a phase-locked loop (PLL) (not illustrated) provides an in-phase local oscillator (LOp) to a mixer 705 to demodulate RFINS into an in-phase intermediate frequency (IF) version of RFINS. Alternatively, the PLL may have an output signal frequency such that mixer 705 directly down-converts RFINS into an in-phase baseband version of RFINS. The PLL also provides a quadrature-phase LO signal (LOq) to a mixer 710 to demodulate RFINS into a quadrature-phase IF or baseband (depending upon whether a heterodyne or direct downconversion architecture is implemented) version of RFINS. A similar demodulation of RFFB through a mixer 715 and a mixer 720 produces I and Q versions of RFFB, respectively.

The resulting I and Q signals may be each processed through a corresponding low pass filter (LPF) and variable-gain amplifier (VGA) 725 through 728. The gain adjusted and filtered output signal from LPF & VGA 725 is digitized in an analog-to-digital converter (ADC) 730 responsive to a clock signal C1. Similarly, the output signal from LPF & VGA 726 is digitized in an ADC 731 responsive to the clock signal C2. However, the output signal from LPF & VGA 727 is digitized in an ADC 732 responsive to a clock signal C2 as is the output signal from LPF & VGA 728 digitized by an ADC 733 responsive to the clock signal C2. The digitized output signals from ADCs 730 may then be latched at a latch 740 responsive to a clock signal C3 before processing within a processor such as a digital signal processor (DSP) 745. The resulting digital in-phase and quadrature-phase baseband (or IF) versions of RFINS are designated as P1 and Q1, respectively. Similarly, the digital in-phase and quadrature-phase baseband (or IF) versions of RFFB are designated as P2 and Q2, respectively.

Figure 8:
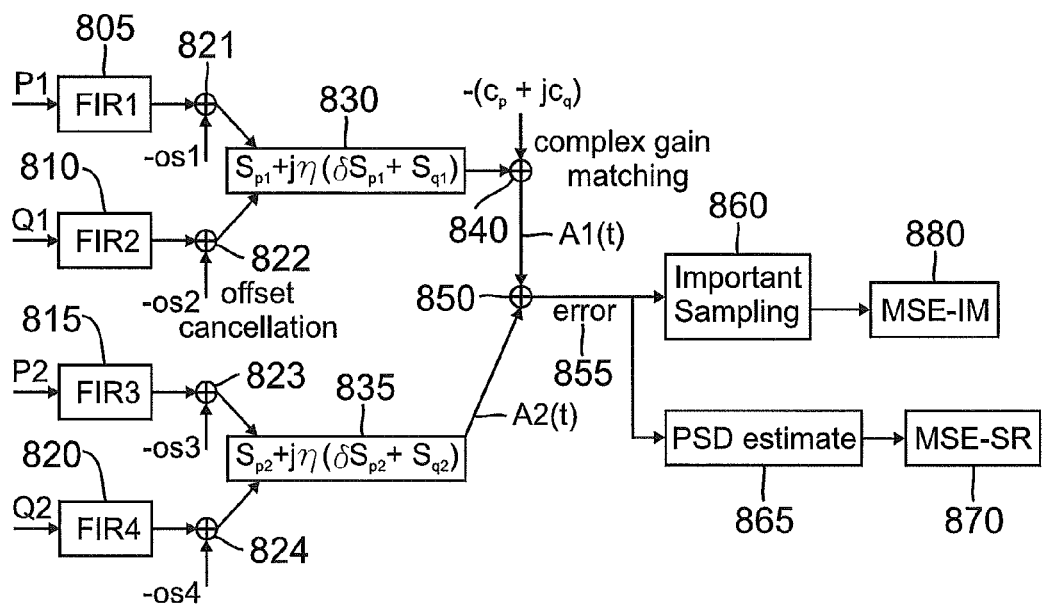
FIG. 8 illustrates additional digital signal processing within the SPM of FIG. 1 for time-aligning, gain-matching, and phase-aligning the RF feedback signal and the RF input signal prior to calculating the error signal.

Turning now to FIG. 8, digital signal processing steps administered by DSP 745 are illustrated. Signals P1, Q1, P2, and Q2 are filtered in finite impulse response (FIR) filters 805, 810, 815, and 820, respectively. To offset any imbalances between the I and Q signal portions, the output signal from each FIR may be added to an offset signal. For example, an offset signal os1 adds to filtered P1 in an adder 821 whereas filtered signals Q1, P2, and Q2 are added to offset signals os2, os3, and os4 in corresponding adders 822, 823, and 824, respectively. By adding the output signals from adders 821 and 822, a combined complex signal 830 is formed as the quantity $(S_{P1}+j\eta(\delta S_{P1}+S_{Q1})$ where $S_{P1}$ represents the filtered output signal from filter 805, $S_{Q1}$ represents the filtered output signal from filter 810, and factors $\delta$ and $\eta$ results from the offset cancellation provided by offset signal os1 and os2. Similarly, by adding the output signals from adders 823 and 824, a combined complex signal 835 is formed as the quantity $(S_{P2}+j\eta(\delta S_{P2}+S_{Q2})$ where $S_{P2}$ represents the filtered output signal from filter 815, $S_{Q2}$ represents the filtered output signal from filter 820, and factors $\delta$ and $\eta$ results from the offset cancellation provided by offset signal os3 and os4. The SPM includes an adder 840 for adjusting signal 830 by a complex gain matching factor—$(C_p+j(C_q))$ to form a delayed, gain-adjusted, and phase-adjusted version of RFINS designated as signal A1($t$), where Cp is the real part of a complex gain adjusting coefficient C and Cq is the imaginary part of coefficient C. Similarly, signal 835 represents a delayed, gain-adjusted, and phase-adjusted version of RFFB designated as signal A2($t$). An adder 850 forms an error signal $e_{BB}(kT_s)$ 855 as A2($t$)–C*A1($t$), where C is the complex gain adjusting coefficient.

In one embodiment, the SPM selects coefficient C so as to minimize the mean-square error. Thus, C can be calculated from the following expression:

$$C=\Sigma_k A1^*(tk)A2(tk)/\Sigma_k A1^*(tk)A1(tk)$$

where A1($tk$) represents the value of A1($t$) at a particular time increment tk, A1*(tk) represents the complex conjugate value of A1($t$) at time tk, and A2($tk$) represents the value of A2($t$) at time tk. In this fashion, the signals RFINS and RFFB may be properly delayed, gain-matched, and phase-matched to compensate for group delays and gain and phase imbalances. Referring back to FIG. 7, it may be seen that clock signals C1 and C2 act as coarse time delay adjustment factors whereas FIR filters 805 through 820 act as adjustable delay lines to provide a fine time delay adjustment. The SPM adjusts these factors to minimize the mean square of error signal 855.

Referring again to FIG. 8, the SPM may form a cost function of the error signal 855 using either a time-domain analysis such as important sampling 860 or a spectral decomposition technique such as through forming the power spectral density (PSD) 865. Both techniques will tend to minimize the mean square of the error signal (MSE). Thus, the SPM may provide a spectrally-resolved MSE (designated as MSE-SR 870) or an importance-sampled MSE (designated as MSE-IM 880). As known in the art, an importance sampling may act to minimize large error magnitudes and/or a large amplitude in signal A1($t$). Having generated the error signal and iteratively adapted pre-distortion weights according to a cost function based on the error signal, the SPM is then ready to provide the current pre-distortion weights to polynomial generator and memory compensator module 120. This module will now be discussed in greater detail.

The Polynomial Generator and Memory Compensator

Figure 9:
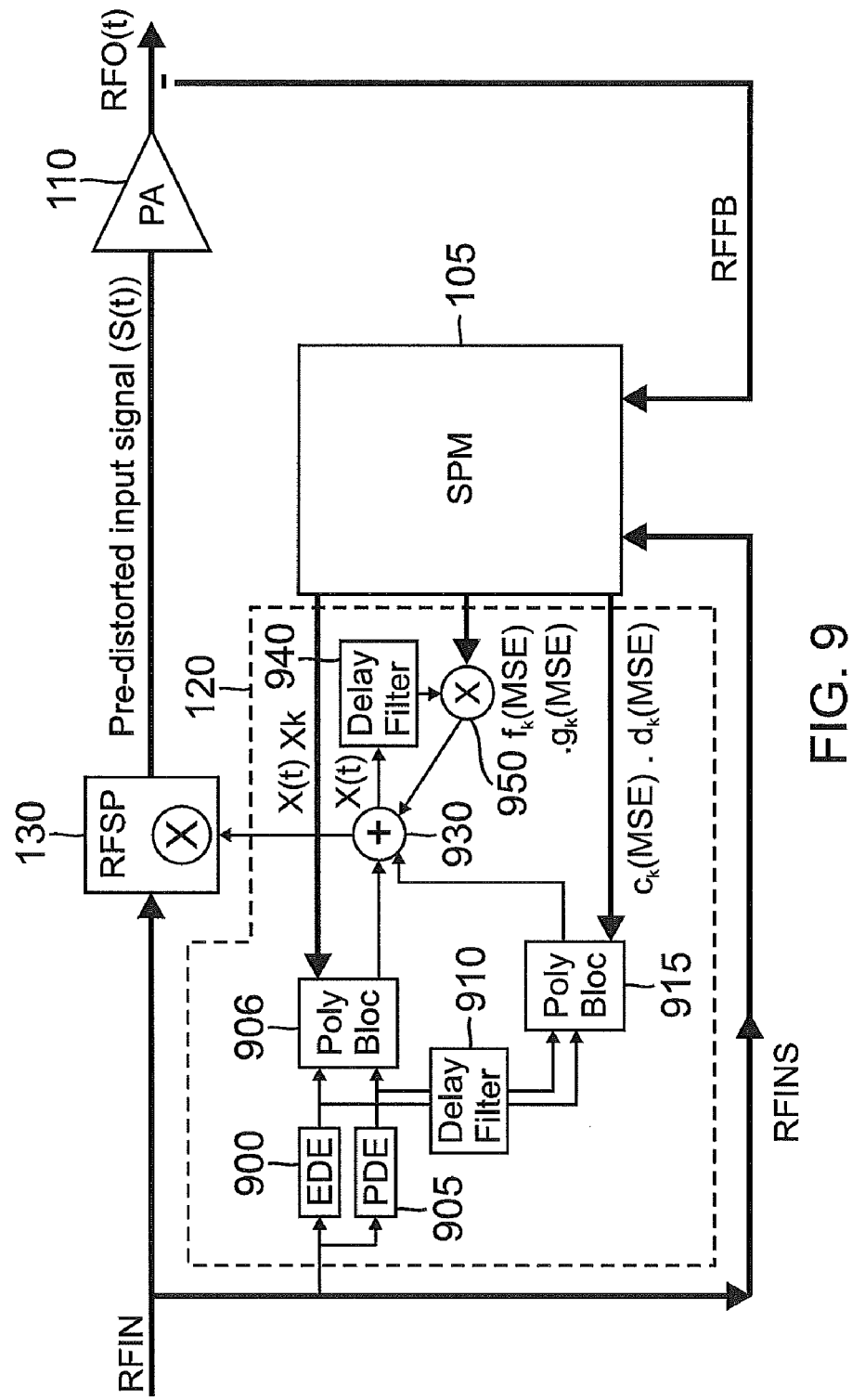
FIG. 9 illustrates signal processing details for a polynomial generator and memory compensator module in the pre-distorter of FIG. 1.

Referring again to FIG. 1, polynomial generator and memory compensator module 120 acts to form the pre-distortion signal provided to RFSP 130 responsive to the current pre-distortion weights calculated by SPM 105 (represented as vector $X_k$). Referring now to FIG. 9, an example polynomial generator and memory compensator module 120 is shown in further detail. Module 120 may use both feedback and feedforward mechanisms to account for memory effects within power amplifier 110. Memory effects within power amplifier 110 cause its amplified output signal, which is designated as RF Out (RFO(t)), to depend upon past behavior of the amplifier input signal. For example, if the pre-distorted RF input signal provided to the power amplifier is represented as S(t), then an example memory-effect-dependent RFO(t) may be represented as a function of S(t)+S(t–Td)+S(t–2*Td)+ . . . S(t–n*Td), where Td represents a memory effect delay and n is an arbitrary positive integer. If the SPM were to adapt a set of pre-distortion weights merely to weight S(t), the non-linearities introduced by the memory effects of S(t–Td) and other delayed versions of S(t) would be unaddressed. To address the memory effects, module 120 includes an envelope detector (EDE) 900 to detect the envelope R(t) and a power detector 905 to detect R(t)$^2$. Recall that the polynomial order in the pre-distorted RF input signal provided to the power amplifier is arbitrary and is a tradeoff between algorithmic complexity and the degree of linearization desired. In one embodiment, RFSP 130 generates up to the $7^{th}$ power of the envelope in the pre-distorted RF input signal. To generate the necessary envelope powers, the envelope and the envelope squared terms from detectors 900 and 905 may be multiplied as necessary in a first polynomial module 906. In that regard, $R(t)$ multiplied by $R(t)^2$ produces $R(t)^3$, and so on. First polynomial block 906 uses the resulting non-delayed powers of the envelope and the current pre-distortion weight vector $X_k$ from SPM 105 to generate a current pre-distortion signal such as the polynomial $\alpha_1 + \alpha_2 * R(t) + \alpha_3 * R(t)^2 + \alpha_4 * R(t)^3 + \ldots$ discussed previously.

To account for memory effects, the envelope and envelope squared terms are delayed in a delay filter bank 910 according to the memory order one wishes to account for in the resulting system. Delay filter bank 910 is designated as a "bank" because it may comprise a plurality of delay filters arranged in parallel, where each delay filter provides a unique delay equaling a integer multiple of a delay increment. For example, if the pre-distorted RF input signal to the power amplifier is to include only the delay terms $S(t-Td)$ and $S(t-2*Td)$ discussed above, then delay filter bank 910 would have a first delay filter configured to produce a delayed version of the envelope as $R(t-Td)$ and a second delay filter configured to provide another delayed version of the envelope as $R(t-2*Td)$. The delay factor Td is variable and can be adjusted according to a particular power amplifier's memory effects. Should the pre-distorted RF input signal provided to the power amplifier include only the two delay terms discussed above, delay filter bank 910 would also produce two different delayed versions of the envelope squared term $R(t-Td)^2$ and $R(t-2*Td)^2$. A second polynomial module 915 receives pre-distortion weights from SPM 105 to generate corresponding polynomials from these delayed envelope signals. Module 915 may generate the necessary delayed powers of the envelope by multiplying the delayed envelope signal and the delayed envelope squared signal analogously as discussed for module 906. In this fashion, module 915 produces $R(t-Td)^3$, $R(t-Td)^4$, $R(t-2Td)^3$, $R(t-2Td)^4$, and so on. If delay bank 910 is configured to produce the two different delayed versions of $R(t)$ and $R(t)^2$ discussed above, then a first delayed polynomial from module 915 could correspond to $\alpha_1' + \alpha_2'*R(t-Td) + \alpha_3'*R(t-Td)^2 + \alpha_4'*R(t-Td)^3 + \ldots$, where the pre-distortion weights are annotated with a prime symbol because they may be separately adapted by SPM 105. In other words, SPM 105 would adapt not only vector $X_k$ but also a vector $X_k'$, which is a vector of the pre-distortion weights for the first delayed polynomial. This iterative adaptation for vector $X_k'$ would occur in parallel in the same fashion as discussed above for vector $X_k$. Alternatively, the same pre-distortion weights may be used for both polynomials, albeit at the cost of increasing non-linearity. Referring again to the example of two independently-delayed output signals from delay filter bank 910, a second polynomial from module 915 would correspond to $\alpha_1'' + \alpha_2''*R(t-2Td) + \alpha_3''*R(t-2Td)^2 + \alpha_4''*R(t-2Td)^3 + \ldots$, where the pre-distortion weights are annotated with a double prime symbol because these weights may be independently adapted by the SPM as compared to the remaining pre-distortion weights. In this fashion, module 915 produces delayed polynomials according the memory effect order one desires to address.

The resulting polynomials from modules 906 and 910 may be added in an adder 930 that provides the pre-distortion signal (designated as $x(t)$) to RFSP 100. To address both short-term and long-term memory effects, module 120 may include a feedback of signal $x(t)$ through a delay filter bank 940. Filter bank 940 is analogous to delay filter bank 910 in that delay filter bank 940 may comprise a plurality of delay filters arranged in parallel, where each delay filter provides a unique delay equaling a integer multiple of the delay increment Td. Each of the various delayed versions of $x(t)$ provided by delay filter bank 940 may then be weighted by a feedback pre-distortion coefficient provided by SPM 105 in a multiplier 950, where SPM 105 iteratively adapts these coefficients as discussed previously for the other pre-distortion coefficients. An output signal from multiplier 950 is summed by summer 930 and is thus feedback into signal $x(t)$ provided to RFSP 130 as the pre-distortion signal. An example embodiment for RFSP 130 will now be discussed.

The RFSP

In one embodiment, the RFSP implements additive pre-distortion as discussed with regard to the '781 application. Such additive pre-distortion exploits the weakly non-linear nature of non-linear circuits such as power amplifiers. In other words, amplifiers are designed to be predominately linear such that a linear portion of an amplifier output signal is more powerful than a non-linear portion of the output signal. Appropriate pre-distortion of an amplifier input signal will thus mirror this imbalance between linearity and non-linearity—the linear portion in the pre-distorted amplifier input signal $S(t)$ of FIG. 9 is more powerful than the non-linear portion. Although the non-linear portion of the pre-distorted input signal is relatively weak, it is inherently noisier than the linear portion because of the non-linear operations necessary to produce the various powers of the envelope. To prevent the domination of the signal-to-noise ratio (SNR) in the pre-distorted RF input signal by the noisy non-linear components, the non-linear components in the pre-distorted input signal are formed separately from the linear term such that the pre-distorted input signal is formed by the addition of the non-linear and linear terms. This additive pre-distortion is very advantageous because the signal-to-noise ratio in the pre-distorted input signal is not polluted by the relatively noisy nature of the non-linear terms.

To separate the linear and non-linear formation of the pre-distorted input signal, the non-linear signal portion of the pre-distorted input signal may be formed at a mixer from a version of the input signal and a pre-distorting signal. A first coupler may be used to extract the version of the input signal provided to the mixer such that the input signal is divided into a remaining input signal portion and the extracted version. A second coupler may be used to add the non-linear signal portion from the mixer with the remaining input signal portion to form the pre-distorted input signal. A variable gain amplifier may be used to amplify the remaining input signal portion prior to addition with the non-linear signal portion.

Figure 10:
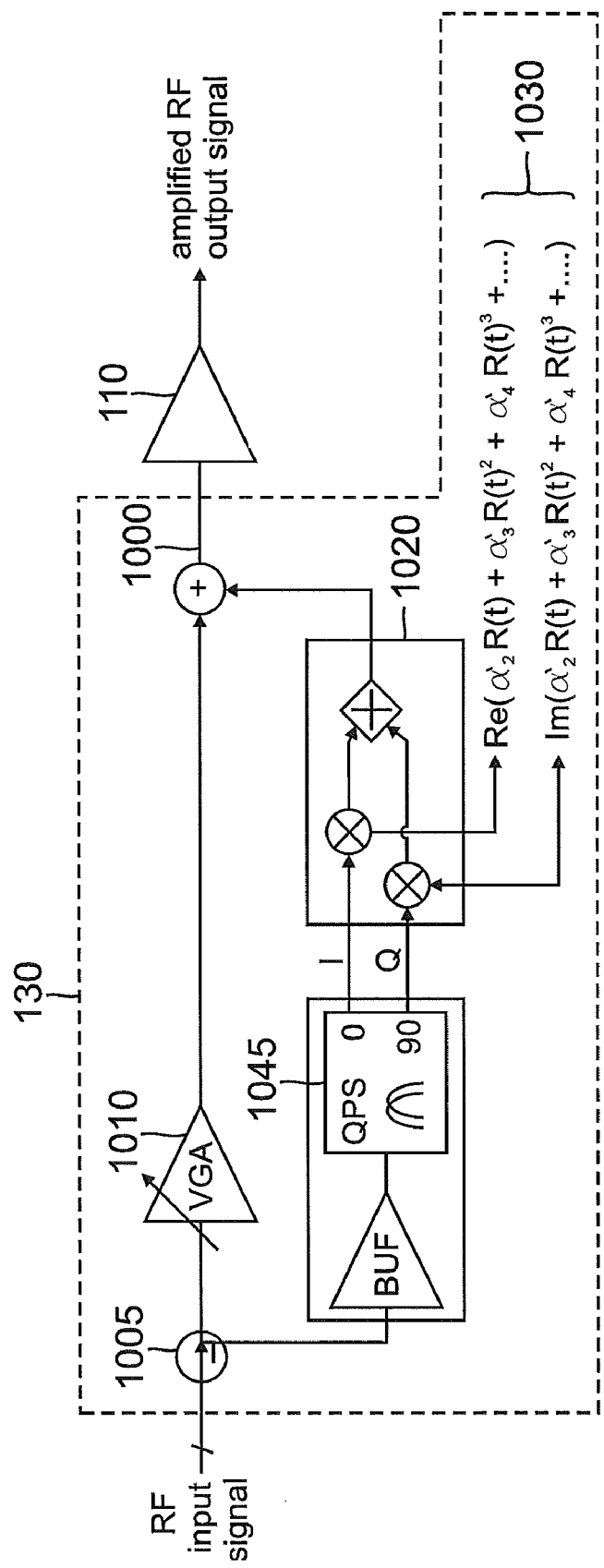
FIG. 10 illustrates an example additive pre-distortion architecture for an RF signal processing circuit in the pre-distorter of FIG. 1.

Additive pre-distortion may be better understood with reference to FIG. 10, which illustrates an example RFSP 130 in greater detail. RFSP 130 provides dramatic improvements in dynamic range through an appropriate decoupling in the production of the linear and non-linear terms in a pre-distorted RF input signal 1000 provided to power amplifier 130. For ease of discussion, it will be assumed that RF input signal 1000 is pre-distorted in the form of the real part of real part of $((\alpha_1*R(t) + \alpha_2*R(t)^2 + \ldots)*\exp(j\omega_c t)$ as discussed previously (in other words, no memory compensation is implemented). The linear term in the pre-distorted RF input signal is produced by an appropriate attenuation (or amplification) of the RF input signal in a variable amplifier 1010. Because there is no I/Q channel formation with regard to the linear term, it may be seen that this linear term cannot be phased according to the complex value of the corresponding coefficient $\alpha_1$ (assuming that the SPM, which is not shown for illustration clarity in FIG. 10 determines that $\alpha_1$ should be complex). However, the remaining non-linear terms in the pre-distorted RF input signal may be formed through the use of a buffer and quadrature demodulator circuit 1045 that demodulates a version of the RF input signal (obtained through a coupler 1005) into I and Q portions. The I and Q portions are mixed with a real and imaginary portion 1030 of the polynomial from module 120 (shown in FIG. 9) in an I/Q mixer and combiner circuit 1020. But note that the I portion (real portion) of the polynomial that mixes with the corresponding I portion of the RF input signal and also the Q portion of the polynomial that mixes with the corresponding Q portion of the RF input signal are not necessarily the same as discussed with previously regard to the polynomial $\alpha_1 + \alpha_2 * R(t) + \alpha_3 * R(t)^2 + \alpha_4 * R(t)^3 + \ldots$ from SPM 105. This is because the I and Q portions of the polynomial may need to be re-phased since the linear portion of the pre-distorted RF input signal has been produced without an I/Q mixing. In other words, the phase relationship between $\alpha_1 * R(t)$ and the remaining non-linear terms in pre-distorted RF input signal 1000 may change because the linear envelope twin is no longer re-phased as it would be if it were multiplied by a complex coefficient $\alpha_1$ in an I/Q fashion. To account for this phase relationship loss, the I and Q portions of the pre-distortion signal may be re-phased by the SPM. Thus, the in-phase portion I and the quadrature-phase portion Q of the pre-distortion signal are denoted as the real and imaginary parts of $[\alpha_2' * R(t)^2 + \alpha_3' * R(t)^3 + \alpha_4' * R(t)^4 + \ldots ]$, respectively, where the alpha coefficients are given a prime signal to signify that these coefficients may differ from those discussed earlier. The additive architecture shown in FIG. 10 has a wider dynamic range and greater signal-to-noise ratio (SNR) as compared to a corresponding RFSP in which the linear term and the non-linear terms in the polynomial(s) from SPM 105 are used to directly multiply the RF input signal. Such a wider dynamic range flows from the fact that the linear term is considerably larger than the remaining terms such that the dynamic range within a non-additive architecture mixer is lost on just the linear term. In contrast, the I and Q signals from demodulator 1045 are mixed to just provide the non-linear terms in the pre-distorted RF input signal. The mixers in circuit 1020 may then be configured to use their full dynamic ranges.

Although embodiments of the invention has been shown and clearly depicted, various other changes, additions and omissions in the form and detail thereof may be made therein without departing from the intent and scope of this invention. For example, embodiments of SPM 105 or polynomial generator and memory compensator module 120 may be used in pre-distorters that do not have an additive architecture to form the pre-distorted RF input signal provided to a power amplifier. In addition, SPM 105 may form its delay, gain, and phase-matched error signal without practicing the iterative adaptation of the pre-distortion coefficients discussed herein but instead could use the correlation technique discussed with regard to the '008 application to form the pre-distortion coefficients. Similarly, pre-distorter embodiments may utilize the disclosed SPM without practicing memory compensation in module 120. The appended claims encompass all such changes and modifications as fall within the true spirit and scope of this invention.

What is claimed is:

1. A pre-distorter for distorting an RF input signal to provide a pre-distorted radio frequency (RF) input signal to an amplifier that provides an amplified RF output signal, wherein the RF input signal has an envelope, comprising:
    a radio-frequency signal processing circuit that distorts the RF input signal according to a polynomial of powers of the envelope, each power of the envelope being weighted by a corresponding pre-distortion weight; and
    a performance monitor operable to compare a version of the amplified RF output signal to a delayed version of the RF input signal to provide an error signal, wherein the performance monitor is configured to iteratively adapt the pre-distortion weights based upon a gradient of a cost function, the cost function being a function of the error signal.

2. The pre-distorter of claim 1, wherein the performance monitor is operable to generate the cost function based upon a power spectral density of the error signal.

3. The pre-distorter of claim 2, wherein the performance monitor is adapted to divide the power spectral density into an in-band portion and an out-of-band portion, the cost function being based upon a weighted combination of the in-band and out-of-band portions.

4. The pre-distorter of claim 1, wherein the performance monitor is operable to generate the cost function based upon an importance sampling of the error signal.

5. The pre-distorter of claim 1, wherein the cost function is the mean square of the error signal.

6. The pre-distorter of claim 1, wherein the performance monitor iteratively adapts the pre-distortion weights by iteratively adapting algorithmic coefficients to provide a set of first coefficients and linearly transforming the first coefficients into the pre-distortion weights.

7. The pre-distorter of claim 6, wherein the performance monitor linearly transforms the first coefficients into the pre-distortion weights to increase a dimensional independence of an error space defined by the error signal.

8. The pre-distorter of claim 1, wherein the cost function is based on an importance sampling of the error signal.

9. The pre-distorter of claim 1, wherein the performance monitor comprises a digital signal processor.

10. A pre-distorter for distorting an RF input signal to provide a pre-distorted radio frequency (RF) input signal to an amplifier that provides an amplified RF output signal, wherein the RF input signal has an envelope, comprising:
    a first means for distorting the RF input signal according to a polynomial of powers of the envelope, each power of the envelope being weighted by a corresponding pre-distortion weight; and
    a second means for comparing a version of the amplified RF output signal to a delayed version of the RF input signal to provide an error signal, wherein the second means is configured to iteratively adapt the pre-distortion weights based upon a gradient of a cost function, the cost function being a function of the error signal.

11. The pre-distorter of claim 10, wherein the second means is operable to generate the cost function based upon a power spectral density of the error signal.

12. The pre-distorter of claim 11, wherein the second means is adapted to divide the power spectral density into an in-band portion and an out-of-band portion, the cost function being based upon a weighted combination of the in-band and out-of-band portions.

13. The pre-distorter of claim 10, wherein the second means is operable to generate the cost function based upon an importance sampling of the error signal.

14. The pre-distorter of claim 10, wherein the cost function is the mean square of the error signal.

15. A method for distorting an RF input signal to provide a pre-distorted radio frequency (RF) input signal to an amplifier that provides an amplified RF output signal, wherein the RF input signal has an envelope, comprising:
    comparing a first version of the RF output signal to a delayed version of the RF input signal to calculate an error signal;

generating a polynomial of powers of the envelope, wherein each power is weighted by a corresponding pre-distortion weight; and iteratively adapting the pre-distortion weights according to a gradient of a cost function of the error signal.

16. The method of claim 15, wherein the cost function is a power spectral density of the error signal.

17. The method of claim 15, wherein iteratively adapting the pre-distortion weights comprises:

iteratively adapting a first set of coefficients according to the gradient of the cost function to form an adapted first set of coefficients; and linearly transforming the adapted first set of coefficients such that dimensions for an error space defined by the error signal have increased independence.

18. The method of claim 15, wherein the cost function is an importance sampling of the error signal.

19. The method of claim 15, further comprising:

forming a polynomial signal of powers of the envelope weighed by the pre-distortion weights;

multiplying a second version of the input signal with the polynomial signal to produce a multiplied signal, the polynomial signal having no constant component such that the multiplication produces no linear versions of the input signal;

adding the multiplied signal to the RF input signal to provide the pre-distorted input signal; and processing the pre-distorted input signal through the amplifier to provide the amplified output signal, wherein the amplified output signal is a substantially linear function of the RF input signal.

* * * * *